United States Patent
Chun et al.

(10) Patent No.: US 10,164,020 B2
(45) Date of Patent: Dec. 25, 2018

(54) SEMICONDUCTOR DEVICE AND METHOD MANUFACTURING THE SAME

(71) Applicants: Hyundai Motor Company, Seoul (KR); Kia Motors Corporation, Seoul (KR)

(72) Inventors: Dae Hwan Chun, Gwangmyeong-si (KR); NackYong Joo, Hanam-si (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 0 days.

(21) Appl. No.: 15/632,077

(22) Filed: Jun. 23, 2017

(65) Prior Publication Data

US 2018/0166539 A1 Jun. 14, 2018

(30) Foreign Application Priority Data

Dec. 13, 2016 (KR) ........................ 10-2016-0169845

(51) Int. Cl.
*H01L 29/78* (2006.01)
*H01L 51/10* (2006.01)
(Continued)

(52) U.S. Cl.
CPC ...... *H01L 29/1608* (2013.01); *H01L 29/4236* (2013.01); *H01L 29/66068* (2013.01); *H01L 29/7802* (2013.01); *H01L 29/7827* (2013.01); *H01L 29/7839* (2013.01); *H01L 51/105* (2013.01)

(58) Field of Classification Search
CPC ............. H01L 29/1608; H01L 29/7827; H01L 29/7802; H01L 29/78642; H01L 29/66068; H01L 29/7839; H01L 21/623487; H01L 21/623885; H01L 29/666666;
(Continued)

(56) References Cited

U.S. PATENT DOCUMENTS

2013/0313576 A1* 11/2013 Nakano ............... H01L 29/8611
257/77
2014/0252473 A1* 9/2014 Loechelt ........... H01L 29/66674
257/342

FOREIGN PATENT DOCUMENTS

| JP | 2003-031591 A | 1/2003 |
| JP | 2011-134910 A | 7/2011 |

(Continued)

*Primary Examiner* — Galina Yushina
(74) *Attorney, Agent, or Firm* — Morgan, Lewis & Bockius LLP

(57) ABSTRACT

A semiconductor device may include an n− type layer disposed at a first surface of an n+ type silicon carbide substrate; a p− type region, a p type region, an n+ type region, and a p+ type region disposed at an upper portion in the n− type layer; a gate electrode and a source electrode disposed on the n− type layer and insulated from each other; and a drain electrode disposed at a second surface of the n+ type silicon carbide substrate, wherein the source electrode is in contact with the p− type region, the n+ type region, and the p+ type region, and the source electrode may include an ohmic junction region disposed at a contact portion of the source electrode and the n+ type region and the contact portion of the source region and the p+ type region and a Schottky junction region disposed at the contact portion of the source electrode and the p− type region.

18 Claims, 18 Drawing Sheets

(51) Int. Cl.
*H01L 29/16* (2006.01)
*H01L 29/423* (2006.01)
*H01L 29/66* (2006.01)

(58) Field of Classification Search
CPC ............. H01L 29/788; H01L 29/66712; H01L 51/105; H01L 29/806
See application file for complete search history.

(56) References Cited

FOREIGN PATENT DOCUMENTS

| | | | |
|---|---|---|---|
| JP | 2015-173290 A | 10/2015 |
| JP | 2015-185700 A | 10/2015 |
| KR | 10-2001-0024977 A | 3/2001 |
| KR | 10-2004-0036914 A | 5/2004 |
| KR | 10-1187084 B1 | 9/2012 |

* cited by examiner

SEMICONDUCTOR DEVICE AND METHOD MANUFACTURING THE SAME

CROSS-REFERENCE(S) TO RELATED APPLICATIONS

The present application claims priority to Korean Patent Application No. 10-2016-0169845 filed on Dec. 13, 2016, the entire contents of which are incorporated herein for all purposes by this reference.

BACKGROUND OF THE INVENTION

Field of the Invention

The present invention relates to a semiconductor device including a silicon carbide (SiC) and a manufacturing method thereof.

Description of Related Art

A power semiconductor device requires a low on-resistance or a low saturation voltage to reduce a power loss in a conduction state while allowing a particularly large current to flow. Also, a characteristic that can withstand a reverse direction high voltage of a PN junction applied to both ends of the power semiconductor device at an off state or the moment that a switch is turned off, that is, a high breakdown voltage characteristic, is required.

For modularizing the multiple power semiconductor devices satisfying a basic electrical condition and physical property condition into one package, a number and an electrical specification of the power semiconductor devices in the power semiconductor module may be changed depending on conditions required in a system.

In general, a three-phase power semiconductor module is used to form a Lorentz force for driving a motor. That is, a driving state is determined by controlling a current and a power that are input to the motor through the three-phase power semiconductor module.

A conventional silicon IGBT (Insulated Gate Bipolar Transistor) and a silicon diode are applied in the three-phase power semiconductor module; however, there is recently a trend of applying a silicon carbide (SiC) metal oxide semiconductor field effect transistor (MOSFET) and a silicon carbide diode for minimization of a power consumption generated in the three-phase module and increasing switching speed of the module.

When connecting the silicon IGBT or the silicon carbide MOSFET to another diode, a plurality of wiring connections are made, however an existence of a parasitic capacitance and an inductance due to the wiring reduce a switching speed of the module.

The information disclosed in this Background of the Invention section is only for enhancement of understanding of the general background of the invention and should not be taken as acknowledgment or any form of suggestion that this information forms the prior art already known to a person skilled in the art.

BRIEF SUMMARY

Various embodiments of the present invention relates to a silicon carbide semiconductor device performing the MOSFET operation and the diode operation.

A semiconductor device according to an exemplary embodiment of the present invention includes an n− type layer disposed at a first surface of an n+ type silicon carbide substrate; a p− type region, a p type region, an n+ type region, and a p+ type region disposed at an upper portion in the n− type layer; a gate electrode and a source electrode disposed on the n− type layer and insulated from each other; and a drain electrode disposed at a second surface of the n+ type silicon carbide substrate, wherein the source electrode is in contact with the p− type region, the n+ type region, and the p+ type region, and the source electrode includes an ohmic junction region disposed at a contact portion of the source electrode and the n+ type region as well as the contact portion of the source electrode and the p+ type region, and a Schottky junction region disposed at the contact portion of the source electrode and the p− type region.

An ion doping concentration of the p type region may be larger than the ion doping concentration of the p− type region and may be smaller than the ion doping concentration of the p+ type region.

The source electrode may be in contact with the p type region, and the ohmic junction region may be further disposed at the contact portion of the source electrode and the p type region.

The semiconductor device according to an exemplary embodiment of the present invention may further include a trench disposed at the n− type layer, and the source electrode may be disposed in the trench.

The n+ type region and the p type region may be disposed at a side surface of the trench, and the p type region may enclose a lower surface of the n+ type region and one side surface of the n+ type region.

The p− type region may extend to the lower surface of the trench from the side surface of the trench.

The p+ type region may be disposed under the lower surface of the trench.

The semiconductor device according to an exemplary embodiment of the present invention may further include a gate trench disposed at the n− type layer and separated from the trench.

The gate electrode may fill the gate trench.

The n+ type region and the p type region may be disposed between the trench and the gate trench.

One side surface of the n+ type region and the p type region may be in contact with the side surface of the gate trench.

The p+ type region may be disposed adjacent to the n+ type region and the p type region, and the p− type region may be disposed adjacent to the p+ type region.

A semiconductor device according to an exemplary embodiment of the present invention includes forming an n− type layer at a first surface of an n+ type silicon carbide substrate; forming a p− type region in the n− type layer; forming a p type region on the p− type region and in the n− type layer; forming an n+ type region in the p type region; etching the n+ type region, the p type region, and the p− type region to form a trench; forming a p+ type region under a lower surface of the trench; forming a gate insulating layer on the n− type layer, the n+ type region, and the p type region, and a gate electrode on the gate insulating layer; forming an insulating layer on the gate electrode and the gate insulating layer, and a source electrode on the n+ type region, on the insulating layer, and in the trench; and forming a drain electrode at a second surface of the n+ type silicon carbide substrate, wherein the source electrode includes an ohmic junction region and a Schottky junction region.

The source electrode may be in contact with the n+ type region at a side surface of the trench and an upper surface of the n+ type region.

The source electrode may be in contact with the p– type region at the side surface of the trench and the lower surface of the trench.

The source electrode may be in contact with the p+ type region at the lower surface of the trench.

The ohmic junction region may be disposed at the contact portion of the source electrode and the n+ type region as well as the contact portion of the source electrode and the p+ type region, and the Schottky junction region may be disposed at the contact portion of the source electrode and the p– type region.

According to an exemplary embodiment of the present invention, as the source electrode includes the ohmic junction region and the Schottky junction region, the semiconductor device may execute the MOSFET operation and the diode operation. Accordingly, a wiring connecting a conventional MOSFET device and a conventional diode device may be omitted wherein an area of the device may be reduced.

Also, as one semiconductor device executes the MOSFET operation and the diode operation without the wiring, a switching speed of the semiconductor device may be improved and a low of a power may be reduced.

The methods and apparatuses of the present invention have other features and advantages which will be apparent from or are set forth in more detail in the accompanying drawings, which are incorporated herein, and the following Detailed Description, which together serve to explain certain principles of the present invention.

Figure 1:
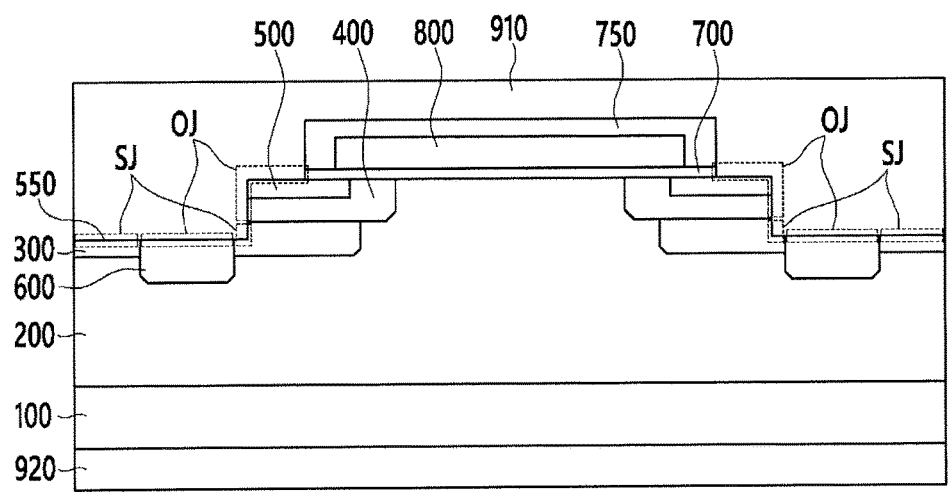
FIG. 1 is a view schematically depicting an example of a cross-sectional of a semiconductor device according to an exemplary embodiment of the present invention.

It should be understood that the appended drawings are not necessarily to scale, presenting a somewhat simplified representation of various features illustrative of the basic principles of the invention. The specific design features of the present invention as disclosed herein, including, for example, specific dimensions, orientations, locations, and shapes will be determined in part by the particular intended application and use environment.

In the figures, reference numbers refer to the same or equivalent parts throughout the several figures of the drawing.

DETAILED DESCRIPTION

Reference will now be made in detail to various embodiments of the present invention(s), examples of which are illustrated in the accompanying drawings and described below. While the invention(s) will be described in conjunction with exemplary embodiments, it will be understood that the present description is not intended to limit the invention(s) to those exemplary embodiments. On the contrary, the invention(s) is intended to cover not only the exemplary embodiments, but also various alternatives, modifications, equivalents and other embodiments, which may be included within the spirit and scope of the invention as defined by the appended claims. In the drawings, the thicknesses of layers and regions are exaggerated for clarity. Also, when a layer is referred to as being "on" another layer or substrate, it may be directly formed on another layer or substrate, or a third layer may be interposed between them.

FIG. 1 is a view schematically depicting an example of a cross-sectional of a semiconductor device according to an exemplary embodiment of the present invention.

Referring to FIG. 1, the semiconductor device according to the present exemplary embodiment includes an n+ type silicon carbide substrate 100, an n– type layer 200, a p– type region 300, a p type region 400, an n+ type region 500, a p+ type region 600, a gate electrode 800, a source electrode 910, and a drain electrode 920.

The n– type layer 200 is disposed at a first surface of the n+ type silicon carbide substrate 100, and a trench 550 is disposed at the n– type layer 200.

The p– type region 300, the p type region 400, the n+ type region 500, and the p+ type region 600 are disposed at a top portion of the n– type layer 200.

The p type region 400 and the n+ type region 500 are in contact with each other and are disposed at a side surface of the trench 550. The p type region 400 is disposed enclosing a lower surface of the n+ type region 500 and one side surface of the n+ type region 500.

The p– type region 300 is disposed under the side surface of the trench 550 and the lower surface of the trench 550. The p+ type region 600 is disposed under the lower surface of the trench 550. The p– type region 300 is divided into a portion enclosing a corner of the trench 550 at the side surface of the trench 550 and extending to the lower surface of the trench 550, and a portion disposed under the lower surface of the trench 550 by the p+ type region 600.

Here, an ion doping concentration of the p type region 400 is larger than the ion doping concentration of the p– type region 300 and is smaller than the ion doping concentration of the p+ type region 600.

On the other hand, in the present exemplary embodiment, the p– type region 300 is separated by the p+ type region 600, however it is not limited thereto and the p– type region 300 may not be separated. In the present case, the p– type region 300 may be disposed under the side surface of the trench 550 and the lower surface of the trench 550, and the p+ type region 600 may be adjacent to the p– type region 300 and may be disposed under the lower surface of the trench 550. Also, the p+ type region 600 may be disposed under the side surface of the trench 550 and the lower surface of the trench 550, and the p− type region 300 may be adjacent to the p+ type region 600 and may be disposed under the lower surface of the trench 550.

The gate insulating layer 700 is disposed on the n− type layer 200, the p− type region 300, and the n+ type region 500, and the gate electrode 800 is disposed on the gate insulating layer 700. The insulating layer 750 is disposed on the gate electrode 800. The insulating layer 750 covers the side surface of the gate electrode 800.

The source electrode 910 is disposed on the n+ type region 500, on the insulating layer 750, and in the trench 550, and the drain electrode 920 is disposed at the second surface of the n+ type silicon carbide substrate 100. Here, the second surface of the n+ type silicon carbide substrate 100 indicates a surface opposite to the first surface of the n+ type silicon carbide substrate 100.

Here, the source electrode 910 is in contact with the p− type region 300, the p type region 400, the n+ type region 500, and the p+ type region 600 and is not in contact with the n− type layer 200. The source electrode 910 is in contact with the n+ type region 500 at the side surface of the trench 550 and the upper surface of the n+ type region 500. Also, the source electrode 910 is in contact with the p type region 400 at the side surface of the trench 550. Also, the source electrode 910 is in contact with the p− type region 300 at the side surface of the trench 550 and the lower surface of the trench 550. Also, the source electrode 910 is in contact with the p+ type region 600 at the lower surface of the trench 550.

The source electrode 910 includes an ohmic junction region OJ and a Schottky junction region SJ. The ohmic junction region OJ is disposed at a contact portion of the source electrode 910 and the n+ type region 500, the contact portion of the source electrode 910 and the p type region 400, and the contact portion of the source electrode 910 and the p+ type region 600. The Schottky junction region SJ is disposed at the contact portion of the source electrode 910 and the p− type region 300.

As the source electrode 910 includes the ohmic junction region OJ and the Schottky junction region SJ, the MOSFET (metal oxide semiconductor field effect transistor) operation and the diode operation are separately realized depending on the voltage application state in the semiconductor device according to an exemplary embodiment of the present invention. That is, the semiconductor device according to an exemplary embodiment of the present invention may include the MOSFET region and the diode region.

As above-described, as the semiconductor device according to the present exemplary embodiment includes the MOSFET region and the diode region, a wiring connecting the conventional MOSFET device and the diode device is not required. Accordingly, an area of the device may be reduced.

Also, as one semiconductor device includes the MOSFET region and the diode region without the wiring, a switching speed of the semiconductor device may be improved.

On the other hand, the p− type region 300, the p type region 400, and the p+ type region 600 that are disposed in the n− type layer 200 are in contact with the n− type layer 200 to form the PN junction, and the PN junction has a shape bent by the shape of the p− type region 300, the p type region 400, and the p+ type region 600.

In the off state of the semiconductor device, the electric field is concentrated to the bent PN junction portion and the Schottky junction region SJ. Accordingly, as a position of the electric field concentration may be varied, the breakdown voltage of the semiconductor device may be increased.

Next, the operation of the semiconductor device according to an exemplary embodiment of the present invention will be described with reference to FIG. 2 to FIG. 5.

Figure 2:
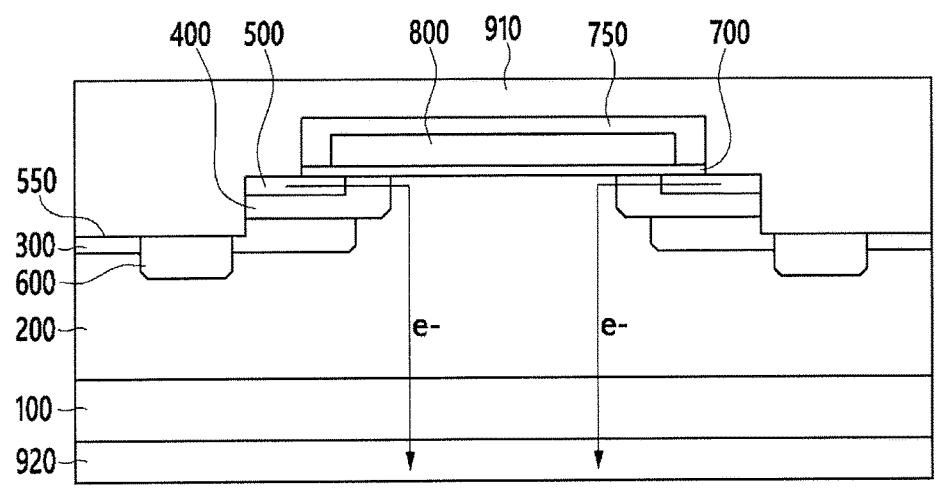
FIG. 2 is a view depicting a MOSFET operation state of the semiconductor device according to FIG. 1.
Figure 3:
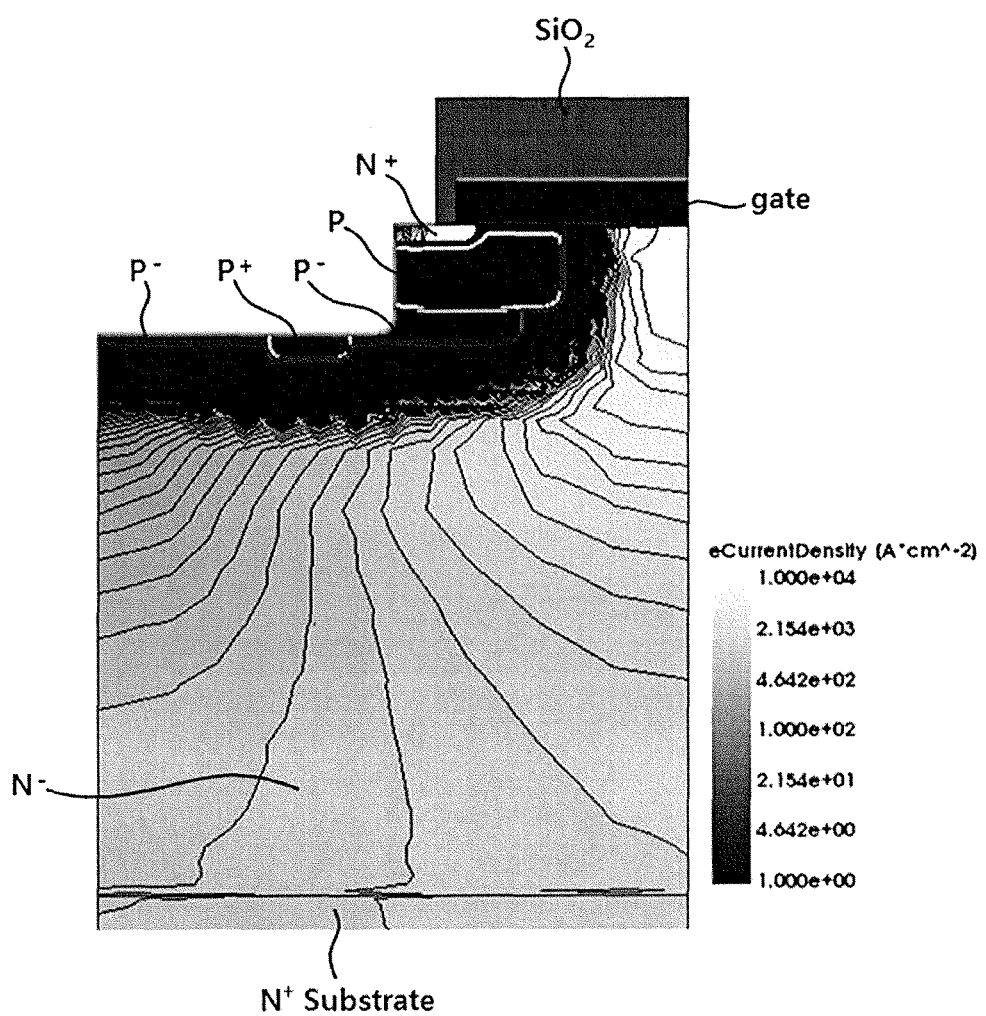
FIG. 3 is a view depicting a simulation result of a MOSFET operation state of the semiconductor device according to FIG. 1.
Figure 4:
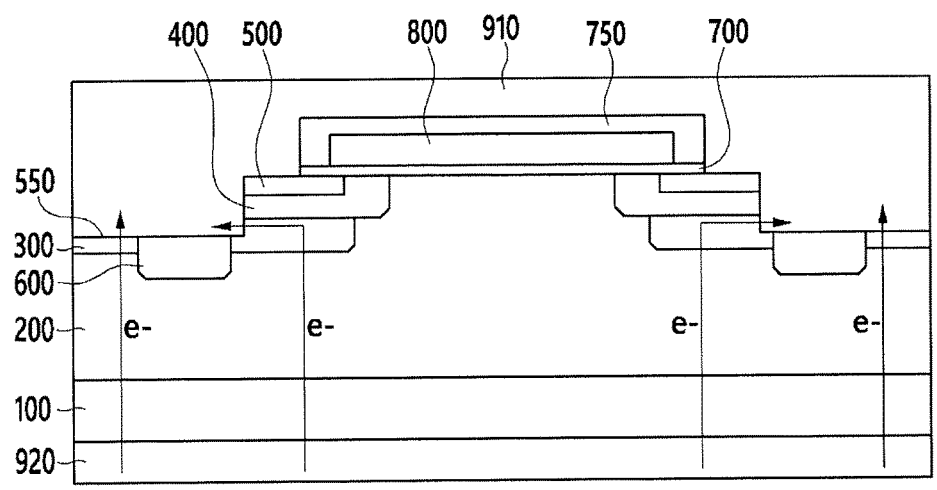
FIG. 4 is a view depicting a diode operation state of the semiconductor device according to FIG. 1.
Figure 5:
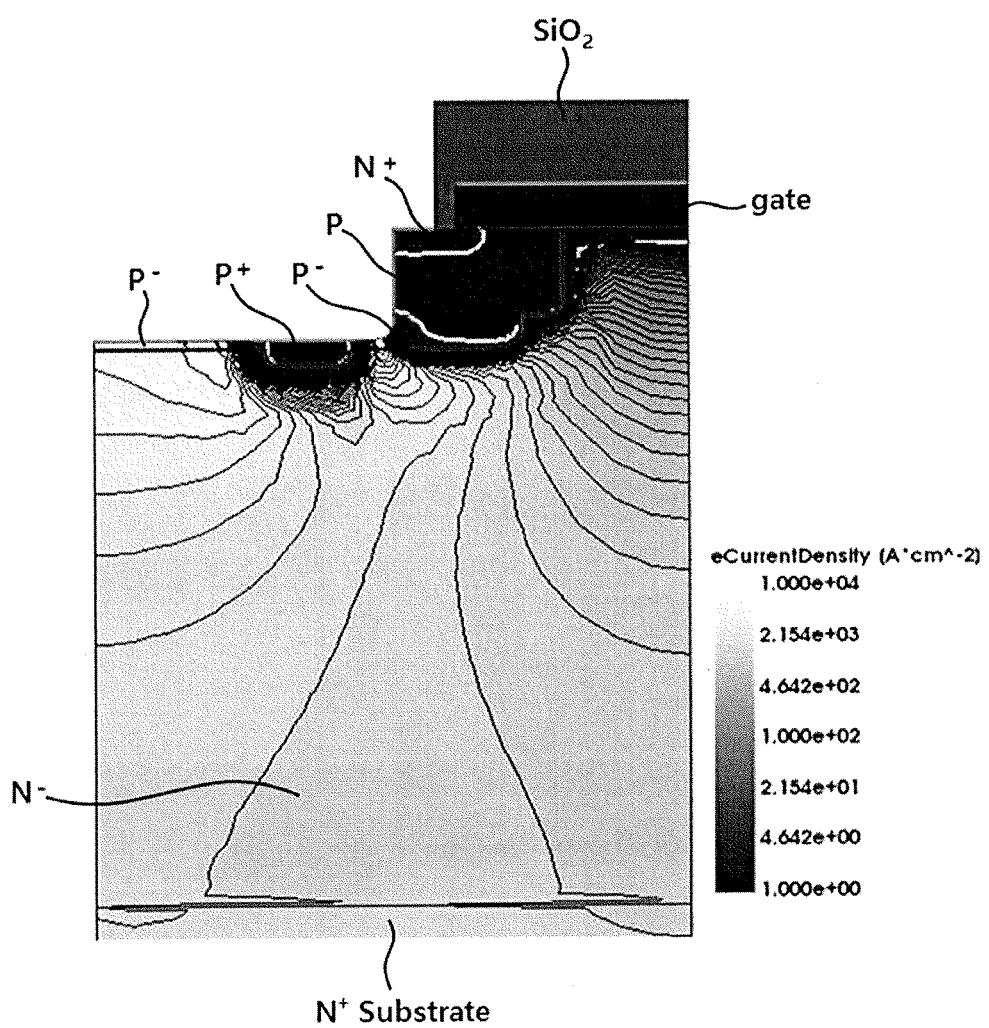
FIG. 5 is a view depicting a simulation result of a diode operation state of the semiconductor device according to FIG. 1.

FIG. 2 is a view depicting a MOSFET operation state of the semiconductor device according to FIG. 1. FIG. 3 is a view depicting a simulation result of a MOSFET operation state of the semiconductor device according to FIG. 1. FIG. 4 is a view depicting a diode operation state of the semiconductor device according to FIG. 1. FIG. 5 is a view depicting a simulation result of a diode operation state of the semiconductor device according to FIG. 1.

The MOSFET operation state of the semiconductor device is achieved with a following condition.

$V_{GS} \geq V_{TH}, V_{DS} > 0$ V

The diode operation state of the semiconductor device is achieved with a following condition.

$V_{GS} < V_{TH}, V_{DS} < 0$ V

Here, $V_{TH}$ is a threshold voltage of the MOSFET, $V_{GS}$ is $(V_G - V_S)$, and $V_{DS}$ is $(V_D - V_S)$. $V_G$ is a voltage applied to the gate electrode, $V_D$ is a voltage applied to the drain electrode, and $V_S$ is a voltage applied to the source electrode.

Referring to FIG. 2, during the MOSFET operation of the semiconductor device, electrons (e−) move from the source electrode 910 to the drain electrode 920. In the present case, the channel is formed in the p type region 400 disposed under the gate electrode 800 wherein a moving path of the electrons (e−) is obtained. That is, the electrons (e−) emitted from the source electrode 910 move to the drain electrode 920 through the p type region 400 and the n− type layer 200 disposed under the gate electrode 800.

Referring to FIG. 3, during the MOSFET operation of the semiconductor device, it may be confirmed that the electrons, or current, flows to the n+ type region N+ in which the ohmic junction region is formed through the channel formed at the p type region P disposed under the gate electrode (gate).

Referring to FIG. 4, during the diode operation of the semiconductor device, the electrons (e−) move from the drain electrode 920 to the source electrode 910. The drain electrode 920 has a function of a cathode, and the source electrode 910 has a function of an anode. Here, the electrons (e−) emitted from the drain electrode 920 move to the source electrode 910 through the p− type region 300 and the n− type layer 200.

Referring to FIG. 5, during the diode operation of the semiconductor device, it may be confirmed that the electrons, or current, flows through a part that the Schottky junction region is formed. Accordingly, the current amount during the diode operation of the semiconductor device may be controlled by controlling the area of the Schottky junction region. Here, the current amount during the diode operation of the semiconductor device is proportional to the area of the Schottky junction region.

Next, a characteristic comparison between the semiconductor device according to the present exemplary embodiment and a general diode device and a general MOSFET device will be described with reference to Table 1.

Table 1 shows a simulation result of the semiconductor device according to the present exemplary embodiment and the general diode device and the general MOSFET device.

A comparative example 1 is a general Junction Barrier Schottky (JBS) diode device, and a comparative example 2 is a general planar gate MOSFET device.

In Table 1, the semiconductor device according to the present exemplary embodiment is controlled to be almost the same as the breakdown voltage of the semiconductor device according to the comparative example 1 and the comparative example 2.

TABLE 1

|  |  | Breakdown voltage (V) | Current density (A/cm$^2$) | Electric current part area (cm$^2$) at 100 A | |
| --- | --- | --- | --- | --- | --- |
| Comparative Example 1 | | 950 | 324 | 0.309 | 0.513 |
| Comparative Example 2 | | 923 | 489 | 0.204 | |
| Exemplary embodiment | Diode operation | 944 | 278 | 0.366 | |
| | MOSFET operation | | 382 | | |

Referring to Table 1, the electric current part area in the current amount of 100 A appears to be 0.309 cm$^2$ in the case of the semiconductor device (the diode) according to the comparative example 1 and appears to be as 0.204 cm$^2$ in the case of the semiconductor device (the MOSFET) according to the comparative example 2. A sum of the electric current part areas for the current amount of 100 A appears to be as 0.513 cm$^2$ in the semiconductor device according to the comparative example 1 and the comparative example 2. In the case of the semiconductor device according to the present exemplary embodiment, the electric current part area for the current amount 100 A appears to be as 0.366 cm$^2$.

That is, as the electric current part area for the current amount 100 A, it may be confirmed that the area of the semiconductor device according to the exemplary embodiment is reduced by approximately 29% for the sum area of the semiconductor device according to the comparative examples 1 and 2.

Next, a manufacturing method of the semiconductor device according to an exemplary embodiment of the present invention will be described with reference to FIG. 1, and FIG. 6 to FIG. 11.

FIG. 6, FIG. 7, FIG. 8, FIG. 9, FIG. 10, and FIG. 11 are views schematically depicting an example of a manufacturing method of a semiconductor device according to an exemplary embodiment of the present invention.

Figure 6:
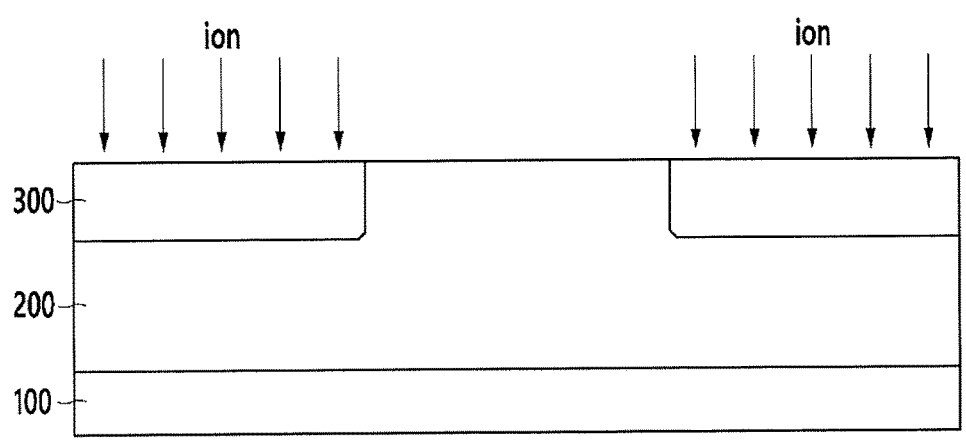
FIG. 6, FIG. 7, FIG. 8, FIG. 9, FIG. 10, and FIG. 11 are views schematically depicting an example of a manufacturing method of a semiconductor device according to an exemplary embodiment of the present invention.

Referring to FIG. 6, an n+ type silicon carbide substrate 100 is prepared, an n− type layer 200 is formed at a first surface of the n+ type silicon carbide substrate 100, and then a p− type region 300 is formed at an upper portion in the n− type layer 200. The p− type region 300 may be formed by injecting a p type ion including boron (B), aluminum (Al), gallium (Ga), and indium (In) to a portion of the n− type layer 200.

Figure 7:
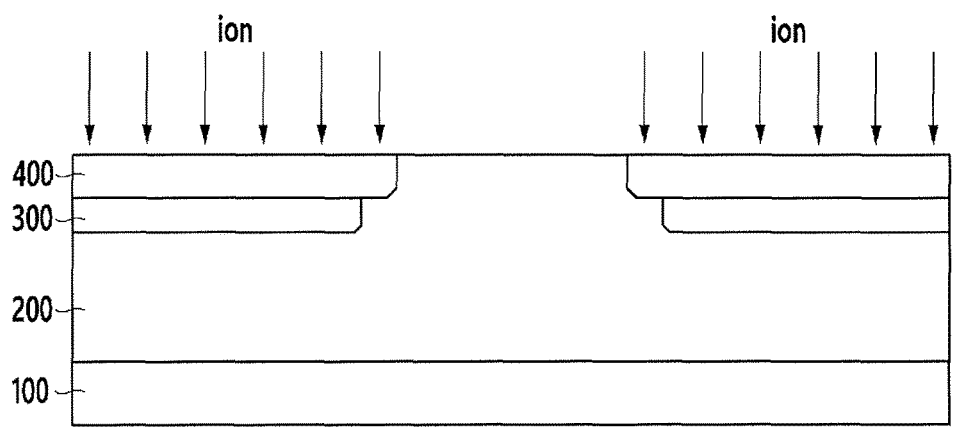

Referring to FIG. 7, a p type region 400 is formed on the p− type region 300 and in the n− type layer 200. The p type region 400 is formed by injecting the p type ion to the parts of the p− type region 300 and the n− type layer 200, and the p− type region 300 is disposed under the p type region 400. An ion doping concentration of the p type region 400 is greater than the ion doping concentration of the p− type region 300.

Figure 8:
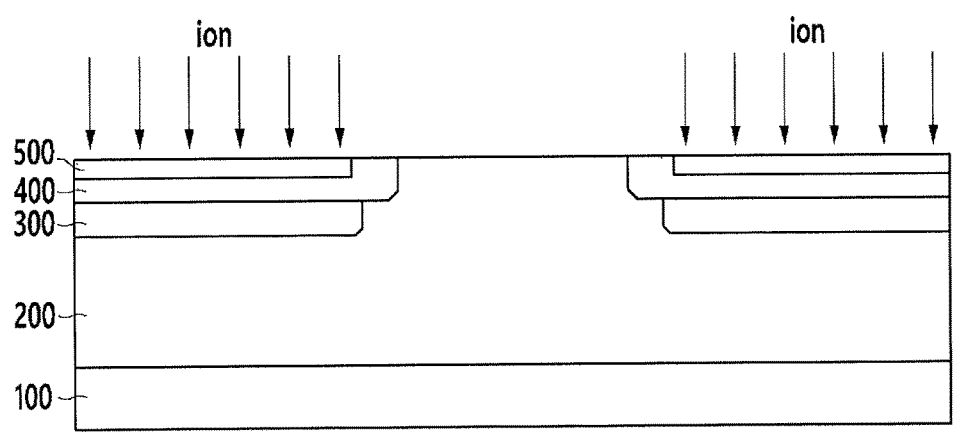

Referring to FIG. 8, an n+ type region 500 is formed in the p type region 400. The n+ type region 500 is formed by injecting an n type ion including nitrogen (N), phosphorus (P), arsenic (As), and antimony (Sb) etc. to the p type region 400.

Figure 9:
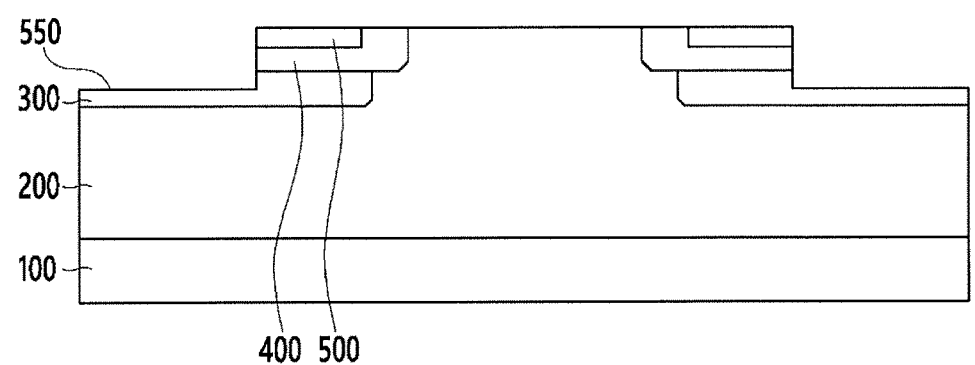

Referring to FIG. 9, the n+ type region 500, the p type region 400, and the p− type region 300 are etched to form a trench 550. In the present case, the n+ type region 500 and the p type region 400 are disposed at the side surface of the trench 550, and the p− type region 300 encloses a corner of the trench 550 at the side surface of the trench 550 and is disposed to extend to the lower surface of the trench 550.

Figure 10:
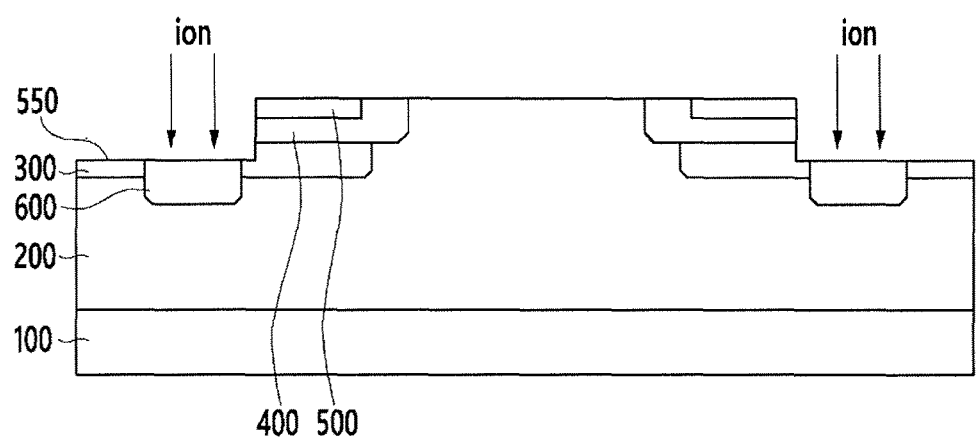

Referring to FIG. 10, the p type ion is injected to the lower surface of the trench 550 to form a p+ type region 600 under the lower surface of the trench 550. The ion doping concentration of the p+ type region 600 is larger than the ion doping concentration of the p type region 400. In the present case, the p− type region 300 encloses the corner of the trench 550 at the side surface of the trench 550 by the p+ type region 600, and is divided into a portion extending to the lower surface of the trench 550 and a portion disposed under the lower surface of the trench 550.

Figure 11:
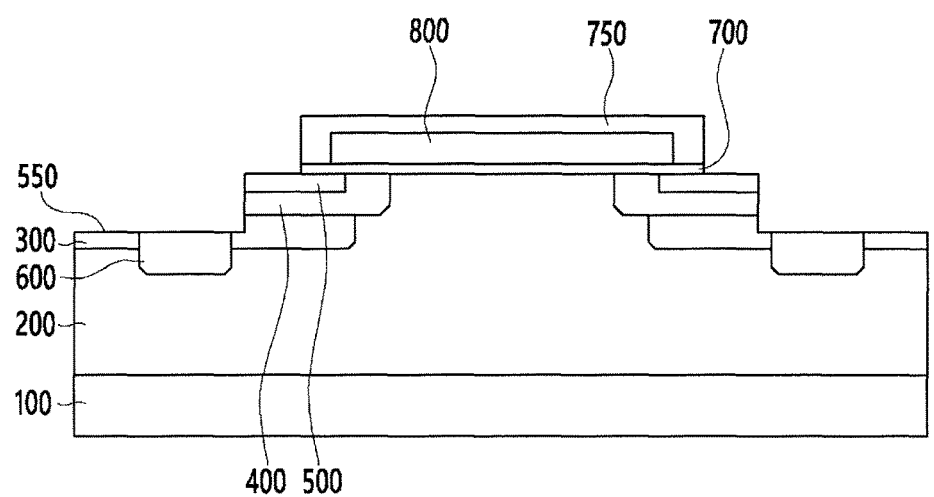

Referring to FIG. 11, a gate insulating layer 700 and a gate electrode 800 are sequentially formed on the n− type layer 200, the p− type region 300, and the n+ type region 500, and then an insulating layer 750 is formed on the gate insulating layer 700 and the gate electrode 800. The insulating layer 750 covers the side surface of the gate electrode 800.

Referring to FIG. 1, a source electrode 910 is formed on the n+ type region 500, on the insulating layer 750, and in the trench 550, and a drain electrode 920 is formed at a second surface of the n+ type silicon carbide substrate 100.

On the other hand, after forming the trench 550, the p− type region 300 may be formed. For the present case, the manufacturing method of the semiconductor device according to another exemplary embodiment of the present invention will be described with reference to FIG. 12, FIG. 13, FIG. 14 and FIG. 15.

FIG. 12, FIG. 13, FIG. 14 and FIG. 15 are views schematically depicting an example of a manufacturing method of a semiconductor device according to another exemplary embodiment of the present invention.

Figure 12:
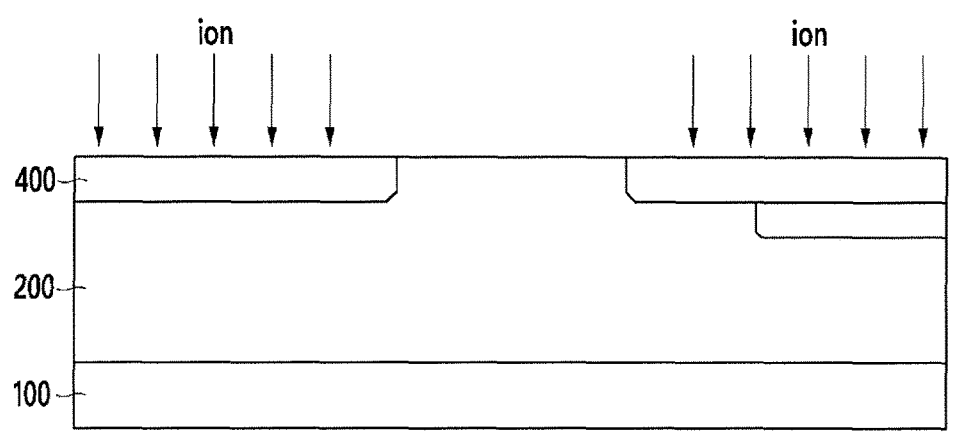
FIG. 12, FIG. 13, FIG. 14 and FIG. 15 are views schematically depicting an example of a manufacturing method of a semiconductor device according to another exemplary embodiment of the present invention.

Referring to FIG. 12, an n+ type silicon carbide substrate 100 is prepared, an n− type layer 200 is formed at a first surface of the n+ type silicon carbide substrate 100, and then a p type region 400 is formed at an upper portion in the n− type layer 200. The p type region 400 may be formed by injecting the p type ion to a portion of the n− type layer 200.

Figure 13:
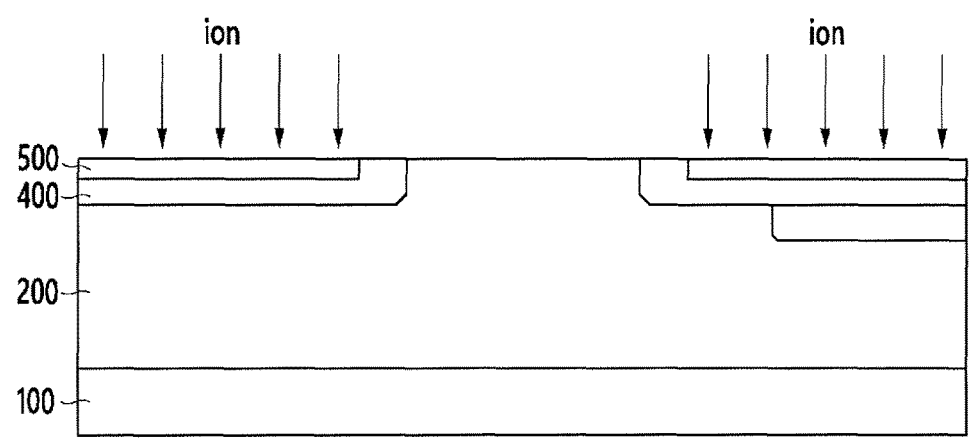

Referring to FIG. 13, an n+ type region 500 is formed by injecting the n type ion to the p type region 400.

Figure 14:
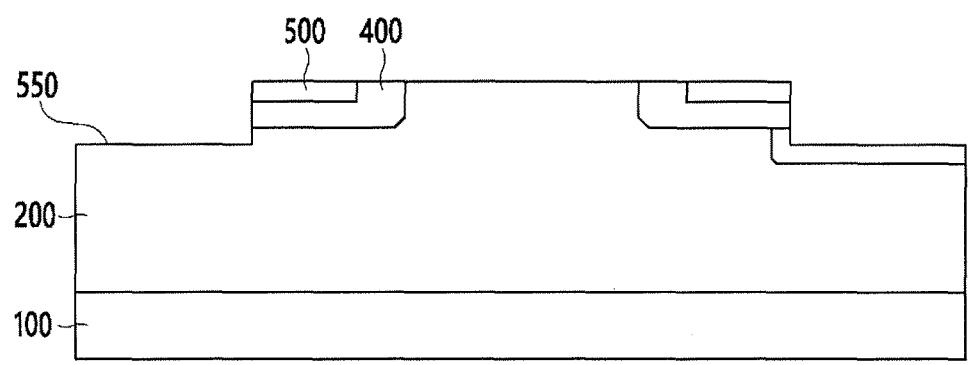

Referring to FIG. 14, the n+ type region 500, the p type region 400, and the n− type layer 200 are etched to form a trench 550. In the present case, the n+ type region 500 and the p type region 400 are disposed at the side surface of the trench 550.

Figure 15:
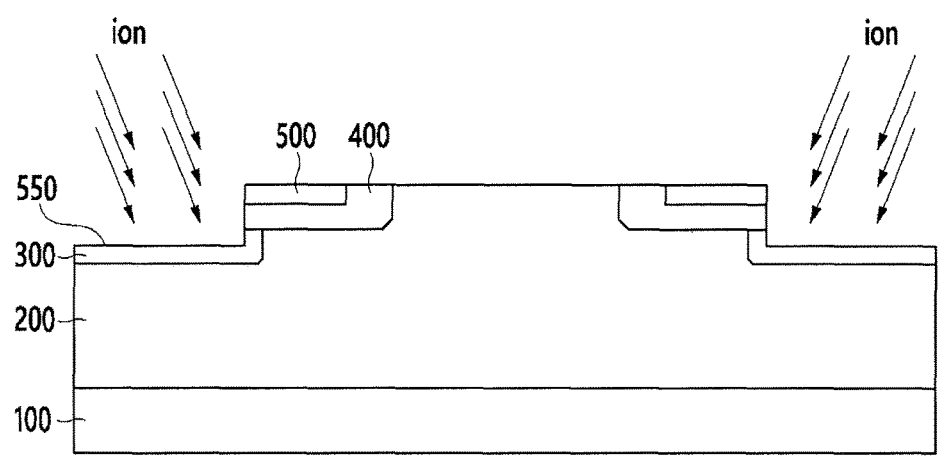

Referring to FIG. 15, a p− type region 300 is formed by injecting the p type ion to the side surface and the lower surface of the trench 550. In the present case, the p− type region 300 encloses the corner of the trench 550 at the side surface of the trench 550, extends to the lower surface of the trench 550, and is disposed. Here, the p type ion is injected by a tilt ion injection method. The tilt ion injection method is an ion injection method wherein an ion injection angle for a horizontal surface is smaller than a right angle.

In the following process, as shown in FIG. 10 the p+ type region 600 is formed, as shown in FIG. 11 the gate insulating layer 700, the gate electrode 800, and the insulating layer 750 are formed, and as shown in FIG. 1 the source electrode 910 and the drain electrode 920 are formed.

Meanwhile, in the semiconductor device according to the present exemplary embodiment, the source electrode 910 is disposed in the trench 550, however it is not limited thereto and the trench 550 may be omitted. Also, the gate electrode 800 may be disposed in the gate trench. For the present, the semiconductor device according to another exemplary embodiment of the present invention will be described with reference to FIG. 16 to FIG. 18.

Figure 16:
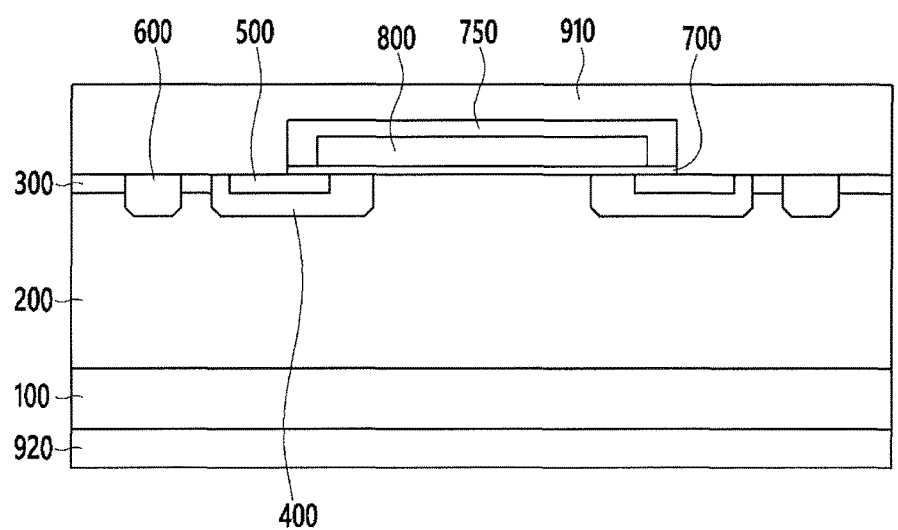
FIG. 16 is a view schematically depicting an example of a cross-sectional of a semiconductor device according to another exemplary embodiment of the present invention.
Figure 17:
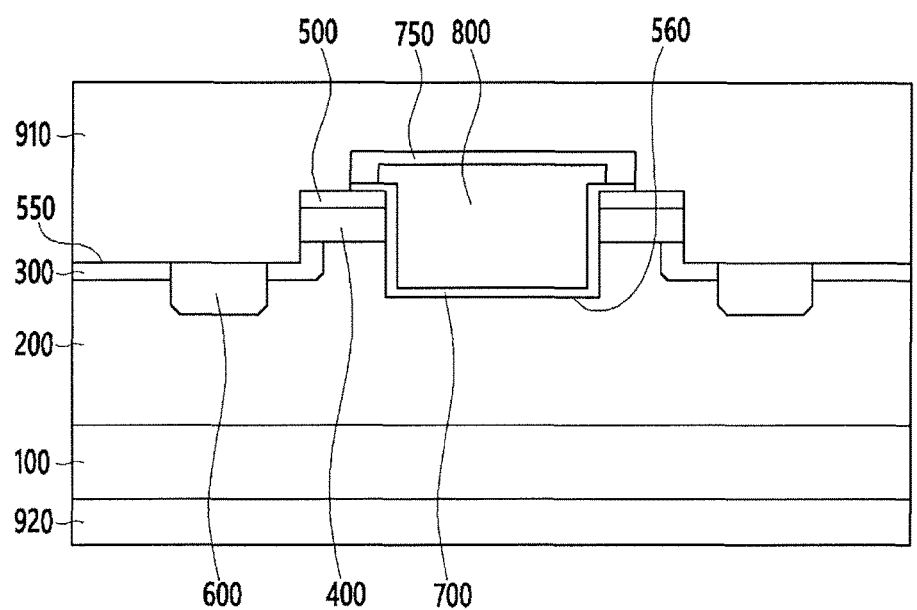
FIG. 17 is a view schematically depicting an example of a cross-sectional of a semiconductor device according to another exemplary embodiment of the present invention.
Figure 18:
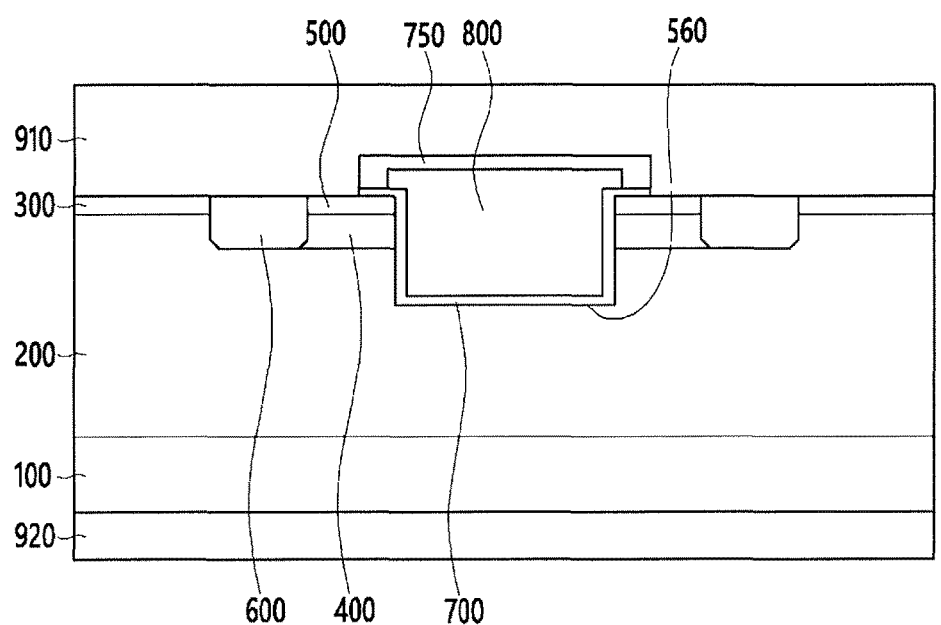
FIG. 18 is a view schematically depicting an example of a cross-sectional of a semiconductor device according to another exemplary embodiment of the present invention.

FIG. 16 is a view schematically depicting an example of a cross-sectional of a semiconductor device according to another exemplary embodiment of the present invention. FIG. 17 is a view schematically depicting an example of a cross-sectional of a semiconductor device according to another exemplary embodiment of the present invention. FIG. 18 is a view schematically depicting an example of a cross-sectional of a semiconductor device according to another exemplary embodiment of the present invention.

Referring to FIG. 16, in the semiconductor device according to the present exemplary embodiment compared with the semiconductor device according to FIG. 1, the trench 550 is omitted.

Next, the structure of the semiconductor device will be described in detail.

The semiconductor device according to the present exemplary embodiment includes an n+ type silicon carbide substrate 100, an n− type layer 200, a p− type region 300, a p type region 400, an n+ type region 500, a p+ type region 600, a gate electrode 800, a source electrode 910, and a drain electrode 920.

The n− type layer 200 is disposed at the first surface of the n+ type silicon carbide substrate 100 and the p− type region 300, the p type region 400, the n+ type region 500, and the p+ type region 600 are disposed at the upper portion in the n− type layer 200.

The p type region 400 and the n+ type region 500 are in contact with each other. The p type region 400 is disposed while enclosing the lower surface of the n+ type region 500 and one side surface of the n+ type region 500.

The p− type region 300 is disposed adjacent to the p type region 400 and is divided into two portions by the p+ type region 600.

On the other hand, in the present exemplary embodiment, the p− type region 300 is divided by the p+ type region 600, however it is not limited thereto and the p− type region 300 may not be divided. In the present case, the p+ type region 600 may be disposed between the p− type region 300 and the p type region 400, or the p− type region 300 may be disposed between the p+ type region 600 and the p type region 400.

The gate insulating layer 700 is disposed on the n− type layer 200, the p− type region 300, and the n+ type region 500, and the gate electrode 800 is disposed on the gate insulating layer 700. The insulating layer 750 is disposed on the gate electrode 800. The insulating layer 750 covers the side surface of the gate electrode 800.

The source electrode 910 is disposed on the p− type region 300, on the p type region 400, on the n+ type region 500, on the p+ type region 600, and on the insulating layer 750, and the drain electrode 920 is disposed at the second surface of the n+ type silicon carbide substrate 100. Here, the second surface of the n+ type silicon carbide substrate 100 indicates the surface opposite to the first surface of the n+ type silicon carbide substrate 100.

Here, the source electrode 910 is in contact with the p− type region 300, the p type region 400, the n+ type region 500, and the p+ type region 600, but is not in contact with the n− type layer 200. The source electrode 910 is in contact with the p− type region 300 at the upper surface of the p− type region 300. Also, the source electrode 910 is in contact with the p type region 400 at the upper surface of the p type region 400. Also, the source electrode 910 is in contact with the n+ type region 500 at the upper surface of the n+ type region 500. Also, the source electrode 910 is in contact with the p+ type region 600 at the upper surface of the p+ type region 600.

The source electrode 910 according to the present exemplary embodiment includes the ohmic junction region and the Schottky junction region like the source electrode 910 according to FIG. 1. The ohmic junction region is disposed at the contact portion of the source electrode 910 and the n+ type region 500, the contact portion of the source electrode 910 and the p type region 400, and the contact portion of the source electrode 910 and the p+ type region 600. The Schottky junction region is disposed at the contact portion of the source electrode 910 and the p− type region 300.

Referring to FIG. 17, the semiconductor device according to the present exemplary embodiment is the same as the rest of the structure of the semiconductor device according to FIG. 1 except for the gate electrode 800 disposed in the gate trench 560. Accordingly, the description for the same structure is omitted.

A trench 550 and a gate trench 560 are disposed at the n− type layer 200. The trench 550 and the gate trench 560 are separated from each other.

A gate insulating layer 700 is disposed in the gate trench 560, and a gate electrode 800 is disposed on the gate insulating layer 700. The gate electrode 800 fills the gate trench 560.

The p type region 400 and the n+ type region 500 are disposed between the trench 550 and the gate trench 560. One side surface of the p type region 400 and the n+ type region 500 is in contact with the side surface of the trench 550, and the other side surface is in contact with the side surface of the gate trench 560.

The p− type region 300 is disposed under the side surface of the trench 550 and the lower surface of the trench 550. The p+ type region 600 is disposed under the lower surface of the trench 550. The p− type region 300 is divided into the portion enclosing the corner of the trench 550 at the side surface of the trench 550 and extending to the lower surface of the trench 550 and the portion disposed under the lower surface of the trench 550 by the p+ type region 600.

In the present case, among the p− type region 300, the portion enclosing the corner of the trench 550 at the side surface of the trench 550 and extending to the lower surface of the trench 550 by the p+ type region 600 is separated from the gate trench 560. However, it is not limited thereto and the portion enclosing the corner of the trench 550 at the side surface of the trench 550 and extending to the lower surface of the trench 550 by the p+ type region 600 may be in contact with the side surface of the gate trench 560.

Meanwhile, in the present exemplary embodiment, the p− type region 300 is divided by the p+ type region 600, however it is not limited thereto and the p− type region 300 may not be separated. In the present case, the p− type region 300 may be disposed under the side surface of the trench 550 and the lower surface of the trench 550, and the p+ type region 600 may be adjacent to the p− type region 300 and may be disposed under the lower surface of the trench 550. Also, the p+ type region 600 may be disposed under the side surface of the trench 550 and the lower surface of the trench 550, and the p− type region 300 may be adjacent to the p+ type region 600 and may be disposed under the lower surface of the trench 550. Also, the p+ type region 600 may be adjacent to the n+ type region 500 and may be disposed on the p type region 400, and the p− type region 300 may be disposed under the side surface of the trench 550 and the lower surface of the trench 550.

Referring to FIG. 18, in the semiconductor device according to the present exemplary embodiment, the trench 550 is omitted and the p− type region 300 is not divided compared with the semiconductor device according to FIG. 17. The rest of the structure is near the same. Accordingly, the description for the same structure is omitted.

In detail, the p type region 400 and the n+ type region 500 are disposed at the side surface of the gate trench 560. The n+ type region 500 is disposed on the p type region 400. The p+ type region 600 is disposed adjacent to the p type region 400 and the n+ type region 500, and the p− type region 300 is disposed adjacent to the p+ type region 600. That is, the p+ type region 600 is disposed between the p− type region 300, and the p type region 400 and the n+ type region 500. Here, the p− type region 300 may be disposed between the p+ type region 600, and the p type region 400 and the n+ type region 500.

The source electrode 910 is disposed on the p− type region 300, on the n+ type region 500, on the p+ type region 600, and on the insulating layer 750.

Here, the source electrode 910 is in contact with the p− type region 300, the n+ type region 500, and the p+ type region 600, but is not in contact with the n− type layer 200. The source electrode 910 is in contact with the p− type region 300 at the upper surface of the p− type region 300. Also, the source electrode 910 is in contact with the n+ type region 500 at the upper surface of the n+ type region 500. Also, the source electrode 910 is in contact with the p+ type region 600 at the upper surface of the p+ type region 600.

For convenience in explanation and accurate definition the appended claims, the terms "upper", "lower", "internal", "outer", "up", "down", "upwards", "downwards", "front", "rear", "back", "inside", "outside", "inwardly", "outwardly", "internal", "external", "forwards", and "backwards" are used to describe features of the exemplary embodiments with reference to the positions of such features as displayed in the figures.

The foregoing descriptions of specific exemplary embodiments of the present invention have been presented for purposes of illustration and description. They are not intended to be exhaustive or to limit the invention to the precise forms disclosed, and obviously many modifications and variations are possible in light of the above teachings. The exemplary embodiments were chosen and described to explain certain principles of the invention and their practical application, to enable others skilled in the art to make and utilize various exemplary embodiments of the present invention, as well as various alternatives and modifications thereof. It is intended that the scope of the invention be defined by the Claims appended hereto and their equivalents.

What is claimed is:

1. A semiconductor device comprising:
   an n− type layer disposed at a first surface of an n+ type silicon carbide substrate;
   a p− type region, a p type region, an n+ type region, and a p+ type region disposed at an upper portion in the n− type layer;
   a gate electrode and a source electrode disposed on the n− type layer and insulated from each other; and
   a drain electrode disposed at a second surface of the n+ type silicon carbide substrate,
   wherein the source electrode is in contact with the p− type region, the p type region, the n+ type region, and the p+ type region,
   wherein the source electrode includes an ohmic junction region and a Schottky junction region,
   wherein the ohmic junction region is disposed at a contact portion of the source electrode and the n+ type region, a contact portion of the source electrode and the p+ type region, and a contact portion of the source electrode and the p type region,
   wherein the Schottky junction region is disposed at a contact portion of the source electrode and the p− type region, and
   wherein an ion doping concentration of the p type region is larger than an ion doping concentration of the p− type region and is smaller than an ion doping concentration of the p+ type region.

2. The semiconductor device of claim 1, further including:
   a trench disposed at the n− type layer, and
   the source electrode is disposed in the trench.

3. The semiconductor device of claim 2, wherein
   the n+ type region and the p type region are disposed at a side surface of the trench, and
   the p type region encloses a lower surface of the n+ type region and a first side surface of the n+ type region.

4. The semiconductor device of claim 3, wherein
   the p− type region extends to a lower surface of the trench from the side surface of the trench.

5. The semiconductor device of claim 4, wherein
   the p+ type region is disposed under the lower surface of the trench.

6. The semiconductor device of claim 5, further including:
   a gate trench disposed at the n− type layer and separated from the trench.

7. The semiconductor device of claim 6, wherein
   the gate electrode fills the gate trench.

8. The semiconductor device of claim 7, wherein
   the n+ type region and the p type region are disposed between the trench and the gate trench.

9. The semiconductor device of claim 8, wherein
   a first side surface of the n+ type region and the p type region is in contact with a side surface of the gate trench.

10. The semiconductor device of claim 1, further including:
    a gate trench disposed at the n− type layer.

11. The semiconductor device of claim 10, wherein
    the gate electrode fills the gate trench.

12. The semiconductor device of claim 11, wherein
    the n+ type region and the p type region are disposed at a side surface of the gate trench, and
    the n+ type region is disposed on the p type region.

13. The semiconductor device of claim 12, wherein
    the p+ type region is disposed adjacent to the n+ type region and the p type region, and
    the p− type region is disposed adjacent to the p+ type region.

14. A method for manufacturing a semiconductor device comprising:
    forming an n− type layer at a first surface of an n+ type silicon carbide substrate;
    forming a p− type region in the n− type layer;
    forming a p type region on the p− type region and in the n− type layer;
    forming an n+ type region in the p type region;
    etching the n+ type region, the p type region, and the p− type region to form a trench;
    forming a p+ type region under a lower surface of the trench;
    forming a gate insulating layer on the n− type layer, the n+ type region, and the p type region and a gate electrode on the gate insulating layer;

forming an insulating layer on the gate electrode and the gate insulating layer and a source electrode on the n+ type region, on the insulating layer, and in the trench; and forming a drain electrode at a second surface of the n+ type silicon carbide substrate, wherein the source electrode includes an ohmic junction region and a Schottky junction region.

15. The method of claim 14, wherein
the source electrode is in contact with the n+ type region at a side surface of the trench and an upper surface of the n+ type region.

16. The method of claim 15, wherein
the source electrode is in contact with the p− type region at the side surface of the trench and the lower surface of the trench.

17. The method of claim 16, wherein
the source electrode is in contact with the p+ type region at the lower surface of the trench.

18. The method of claim 17, wherein
the ohmic junction region is disposed at a contact portion of the source electrode and the n+ type region and a contact portion of the source region and the p+ type region, and
the Schottky junction region is disposed at a contact portion of the source electrode and the p− type region.

\* \* \* \* \*